(12) United States Patent
Dubrule et al.

(10) Patent No.: US 7,529,087 B2
(45) Date of Patent: May 5, 2009

(54) METHOD AND APPARATUS FOR VENTILATING A COMPUTERIZED DEVICE

(75) Inventors: Craig Donald Dubrule, Cary, NC (US); Phong Hoang Ho, Cary, NC (US)

(73) Assignee: Cisco Technology, Inc., San Jose, CA (US)

( * ) Notice: Subject to any disclaimer, the term of this patent is extended or adjusted under 35 U.S.C. 154(b) by 450 days.

(21) Appl. No.: 11/361,297

(22) Filed: Feb. 24, 2006

(65) Prior Publication Data

US 2007/0201181 A1    Aug. 30, 2007

(51) Int. Cl.
H05K 7/20    (2006.01)
G06F 1/20    (2006.01)

(52) U.S. Cl. ............... 361/692; 361/679.5; 361/679.51
(58) Field of Classification Search ............... 361/692, 361/679.5, 679.51
See application file for complete search history.

(56) References Cited

U.S. PATENT DOCUMENTS

| | | | | |
|---|---|---|---|---|
| 4,365,288 | A * | 12/1982 | Robe et al. | 363/141 |
| 5,563,768 | A * | 10/1996 | Perdue | 361/695 |
| 5,969,942 | A * | 10/1999 | Heckner et al. | 361/695 |
| 6,059,385 | A | 5/2000 | Guhl | 312/223.2 |
| 6,081,425 | A * | 6/2000 | Cheng | 361/704 |
| 6,430,052 | B1 | 8/2002 | Kordes et al. | |
| 6,508,704 | B1 * | 1/2003 | Wilson | 454/277 |
| 6,604,799 | B2 | 8/2003 | Searby et al. | 312/223.2 |
| 6,714,416 | B1 | 3/2004 | McLeod et al. | |
| 6,728,104 | B1 | 4/2004 | Ahmad et al. | |
| 6,814,659 | B2 * | 11/2004 | Cigelske, Jr. | 454/184 |
| 6,856,511 | B1 | 2/2005 | Viernes et al. | |
| 6,866,544 | B1 | 3/2005 | Casey et al. | |
| 6,896,043 | B2 * | 5/2005 | Dunn | 165/165 |
| 6,914,780 | B1 | 7/2005 | Shanker et al. | |
| 6,932,443 | B1 * | 8/2005 | Kaplan et al. | 312/213 |
| 7,019,976 | B1 | 3/2006 | Ahmad et al. | |
| 7,173,822 | B2 | 2/2007 | Liang et al. | |
| 7,238,104 | B1 * | 7/2007 | Greenslade et al. | 454/184 |
| 7,352,582 | B2 * | 4/2008 | Yokoyama | 361/703 |
| 2001/0001529 | A1 * | 5/2001 | Behl et al. | 312/223.1 |
| 2001/0004313 | A1 * | 6/2001 | Yamaoka | 361/704 |
| 2002/0055329 | A1 * | 5/2002 | Storck et al. | 454/186 |

(Continued)

FOREIGN PATENT DOCUMENTS

JP    03297198 A * 12/1991

*Primary Examiner*—Anatoly Vortman
(74) *Attorney, Agent, or Firm*—BainwoodHuang

(57) ABSTRACT

A chassis panel for a computerized device includes ventilation elements that visually obscure electronic components disposed within an associated chassis and that minimize airflow resistance. Each ventilation element includes a first angled ventilation portion having openings that provides limited visual access to the electronic components disposed within the chassis. Each ventilation element also includes a second angled ventilation portion having openings that provide no visual access to the electronic components disposed within the chassis. As such, the ventilation elements visually obscure the electronic components disposed within the chassis without the need for additional materials such as screens, mesh, or foam. Also, the openings of the first and second ventilation portions provide the chassis panel with a relatively large free area ratio, such as between about 42% and 48% or greater depending on hole pitch values and opening sizes. As such, the ventilation elements help to maximize air flow through the chassis to allow cooling of the electronic components disposed therein.

23 Claims, 7 Drawing Sheets

U.S. PATENT DOCUMENTS

| | | | |
|---|---|---|---|
| 2002/0173265 A1* | 11/2002 | Kipka et al. | 454/184 |
| 2003/0085025 A1* | 5/2003 | Woods et al. | 165/104.33 |
| 2003/0114099 A1* | 6/2003 | Voorhies | 454/184 |
| 2003/0156385 A1* | 8/2003 | Askeland et al. | 361/687 |
| 2003/0210523 A1* | 11/2003 | Tuttle et al. | 361/687 |
| 2004/0090743 A1* | 5/2004 | Chuang et al. | 361/695 |
| 2004/0217072 A1* | 11/2004 | Bash et al. | 211/26 |
| 2007/0097604 A1* | 5/2007 | Bruski et al. | 361/605 |

* cited by examiner

METHOD AND APPARATUS FOR VENTILATING A COMPUTERIZED DEVICE

BACKGROUND

Computerized devices typically include one or more circuit boards disposed within a housing or chassis. During operation, circuit board components associated with the circuit boards generate heat and, as such, most computerized devices include air flow paths through the chassis to allow cooling of the circuit board components. The design of such air flow paths can vary, depending on the environment in which the computer will be operated. For example, for computers used in a rack-mount setting, in order to maintain efficiency in cooling electronics, the inlet and outlet air flow openings formed in the chassis are maintained in a relatively unimpeded state to maximize cooling efficiency.

In certain cases, computerized devices must comply with government security standards. For example, the Federal Information Processing Standard 140-2 (FIPS 140-2), entitled "Security Requirements for Cryptographic Modules," outlines various security requirements that are to be satisfied by a computerized device utilized within computer or telecommunication systems that protect Sensitive But Unclassified (SBU information. The standard provides four increasing, qualitative levels of security, Levels 1, 2, 3, and 4.

In order to achieve FIPS 140-2 Level 2 compliance, a pattern of air flow openings formed on the computer chassis must be configured to visually obscure and limit external, physical access to, the contents of the chassis (e.g., circuit boards, circuit board components, etc.). In one instance, to achieve Level 2 compliance, certain manufacturers form a series of relatively small openings in a wall of the chassis where the openings are spaced relative closely together. For example, manufacturers form conventional FIPS-compliant openings as square cutouts that are spaced 0.135 inches apart from each other and that have a width of 0.085 inches. In another instance, manufacturers place materials such as screens, mesh, or foam, in proximity to ventilation openings of conventional computer chassis in order to limit visibility and physical access to the components contained therein.

SUMMARY

With respect to airflow, computerized devices that are compliant with FIPS 140-2 Level 2 security standards suffer from a variety of deficiencies. As indicated above, in order to achieve Level 2 compliance, manufacturers can form a perforation pattern in the computerized device's chassis that provides ventilation and that limit visual or physical access to the components contained by the chassis. Additionally, manufacturers can utilize various materials in conjunction with conventional ventilation openings to achieve Level 2 compliance. However, in either case, in order to achieve FIPS compliance the manufacturers often need to reduce the free area ratio (e.g., the ratio of open space relative to non-open space) of the chassis wall which, in turn, increases the chassis' airflow resistance.

For example, as indicated above, manufacturers form FIPS-compliant openings as square cutouts in a computerized device chassis wall where the openings have a width of 0.085 inches and are spaced 0.135 inches apart from each other. With such a perforation pattern, the free area ratio of the chassis wall falls between 30.0% and 33.4%. Such a relatively low free area ratio associated with the chassis can create an air flow bottleneck and can increase the pressure drop within the computerized device. As a result, in order to remove heat from within the chassis, fans associated with the computerized device generally need to spin faster to deliver the same amount of air through the chassis, compared to non-FIPs vent patterns, which consumes more power and generally produce higher acoustic noise levels.

By contrast to conventional FIPS-compliant computerized devices, embodiments of the invention are directed to a chassis panel having ventilation elements that visually obscure electronic components disposed within an associated chassis and that minimize airflow resistance. Each ventilation element includes a first angled ventilation portion having openings that provides limited visual access to the electronic components disposed within the chassis. Each ventilation element also includes a second angled ventilation portion having openings that provide no visual access to the electronic components disposed within the chassis. As such, the ventilation elements visually obscure the electronic components disposed within the chassis without the need for additional materials such as screens, mesh, or foam. Also, the openings of the first and second ventilation portions provide the chassis panel with a relatively large free area ratio, such as between about 42% and 48% for one configuration of the chassis panel. The free area ratio can also be further increased further by using a smaller pitch value between openings or, in the case where electromagnetic interference shielding constraints are negligible, by having relatively larger openings formed on the second angle ventilation portion. As such, the ventilation elements help to maximize air flow through the chassis to allow cooling of the electronic components disposed therein.

In one arrangement, a chassis panel for computerized device includes a support portion defining a plane and a set of ventilation elements extending from the support portion. Each ventilation element includes (i) a first ventilation portion that defines a first angle of less than 180° relative to the plane of the support portion and that defines a first set of openings and (ii) a second ventilation portion that defines a second angle of less than 180° relative to the plane of the support portion and that defines a second set of openings. The set of ventilation elements are configured to control access to an electronic component disposed within the computerized device. The configuration of the ventilation elements minimizes or prevents visual or physical access to the electronic components disposed within the chassis, thereby allowing the chassis to meet FIPS 140-2 Level 2 security standards, while providing adequate air flow through the chassis to allow cooling of the electronic components during operation.

In one arrangement, a computerized device includes a chassis, an electronic component disposed within the chassis, and at least one panel forming a wall of the chassis. The panel includes a support portion defining a plane and a set of ventilation elements extending from the support portion. Each ventilation element includes (i) a first ventilation portion that defines a first angle of less than 180° relative to the plane of the support portion and that defines a first set of openings and (ii) a second ventilation portion that defines a second angle of less than 180° relative to the plane of the support portion and that defines a second set of openings. The set of ventilation elements are configured to control access to the electronic component disposed within the computerized device. The configuration of the ventilation elements minimizes or prevents visual or physical access to the electronic components disposed within the chassis, thereby allowing the chassis to meet FIPS 140-2 Level 2 security standards, while providing adequate air flow through the chassis to allow cooling of the electronic components during operation.

One embodiment of the invention relates to a method for manufacturing a chassis panel. The method includes forming a set of ventilation elements in at least one support portion of a chassis, the set of air ventilation portions having a first ventilation portion that defines a first angle relative to the plane of the support portion and a second ventilation portion that defines a second angle relative to the plane of the support portion. The method further includes forming a first set of openings in the first ventilation portion and forming a second set of openings in the second ventilation portion.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to a chassis panel having ventilation elements that visually obscure electronic components disposed within an associated chassis and that minimize airflow resistance. Each ventilation element includes a first angled ventilation portion having openings that provides limited visual access to the electronic components disposed within the chassis. Each ventilation element also includes a second angled ventilation portion having openings that provide no visual access to the electronic components disposed within the chassis. As such, the ventilation elements visually obscure the electronic components disposed within the chassis without the need for additional materials such as screens, mesh, or foam. Also, the openings of the first and second ventilation portions provide the chassis panel with a relatively large free area ratio, such as between about 42% and 48%. As such, the ventilation elements help to maximize air flow through the chassis to allow cooling of the electronic components disposed therein.

Figure 1A:
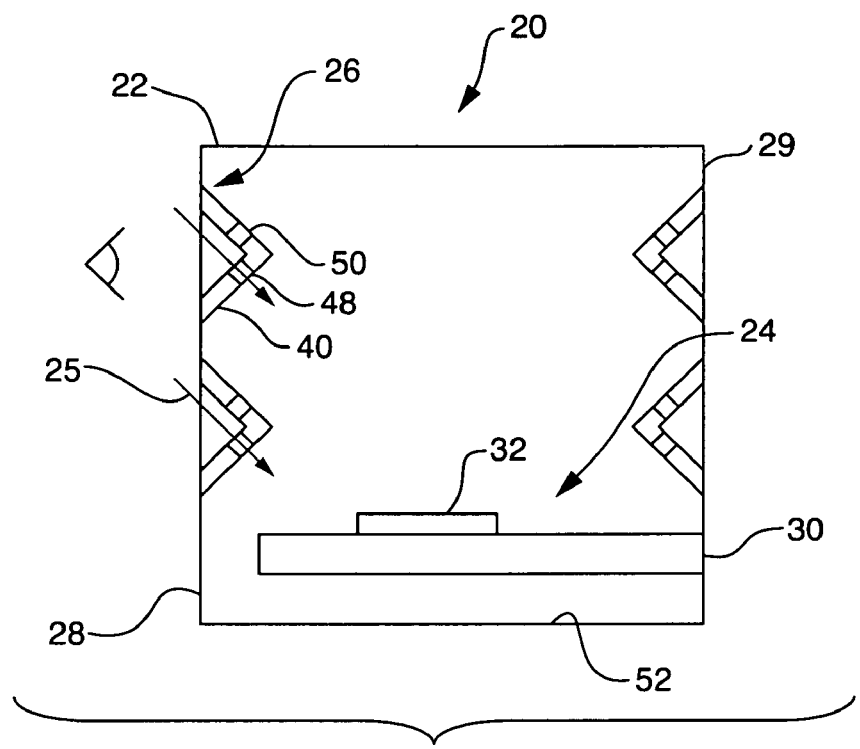
FIG. 1A illustrates a schematic representation of a chassis having ventilation openings extending from a chassis panel, according to one embodiment of the invention.
Figure 1B:
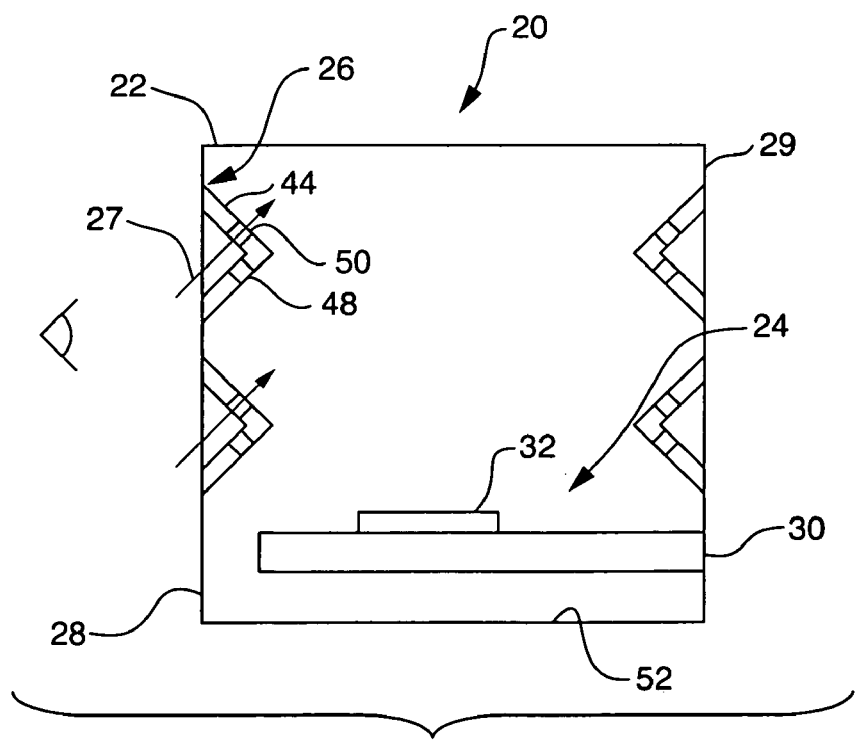
FIG. 1B illustrates a schematic representation of a chassis having ventilation openings, according to one embodiment of the invention.

FIGS. 1A and 1B show a schematic representation of an electronic device or computerized device 20, such as a data communications device or router. The computerized device 20 includes a chassis 22, one or more electronic components 24, such as a circuit board 30 and circuit board components 32 (e.g., a memory or processor), disposed within the chassis 22, and one or more ventilation elements 26. During operation, the circuit board components 32 generate heat that can increase the ambient temperature within the chassis 22. As such, the ventilation elements 26 are configured to allow the heat to be vented from the chassis 22. For example, the computerized device can include a fan assembly (not shown) to draw air into the chassis 22, or expel heated air from within the chassis 22, through the ventilation elements 26. Additionally, the ventilation elements 26 are configured to minimize or prevent visual or physical access to the electronic components 24 disposed within the chassis 22. Details of an embodiment of the chassis 22 and ventilation elements 26 are described below.

Figure 2A:
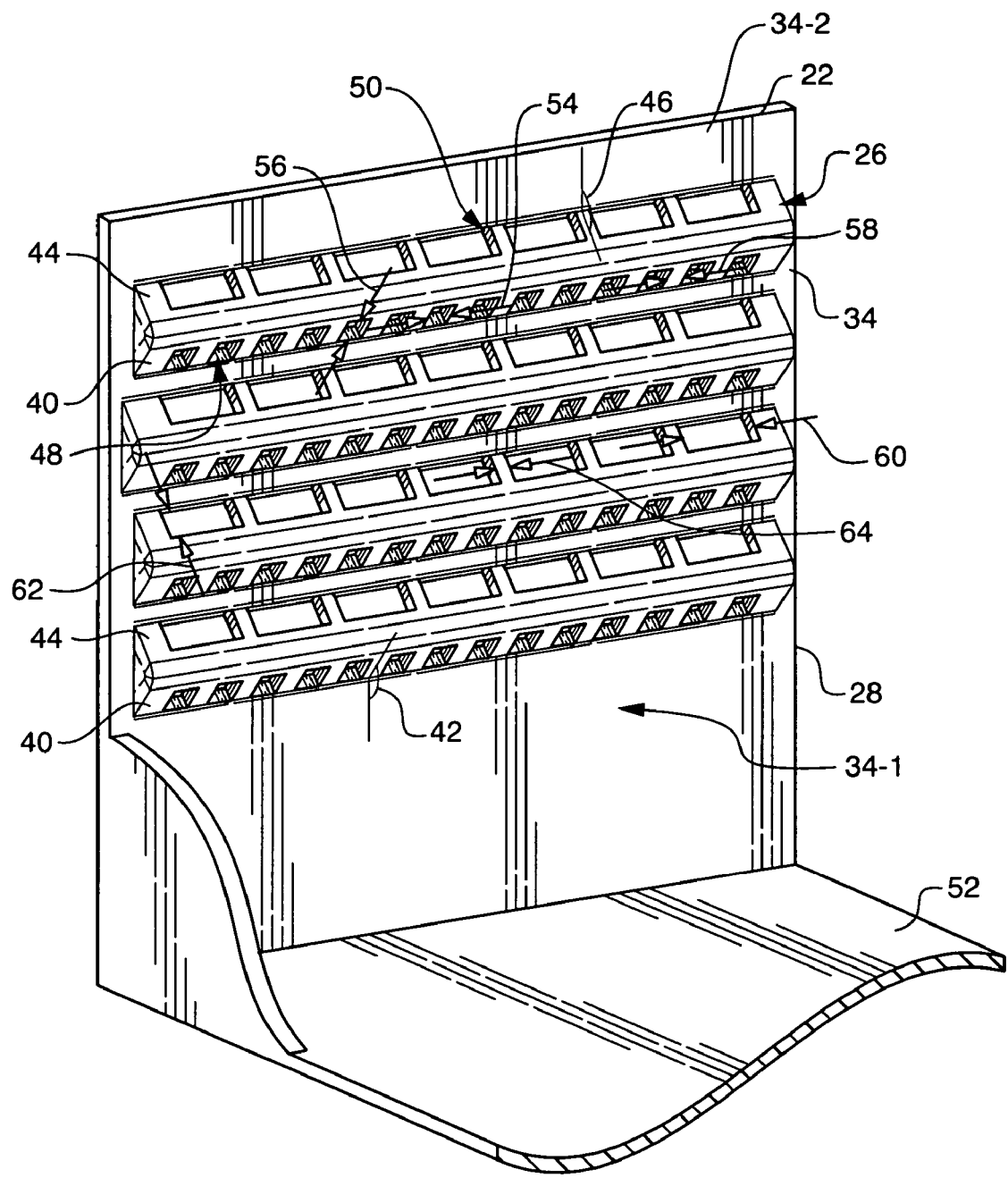
FIG. 2A illustrates a perspective cut-away view showing the inside of the chassis and chassis panel of FIG. 1, according to one embodiment of the invention.
Figure 2B:
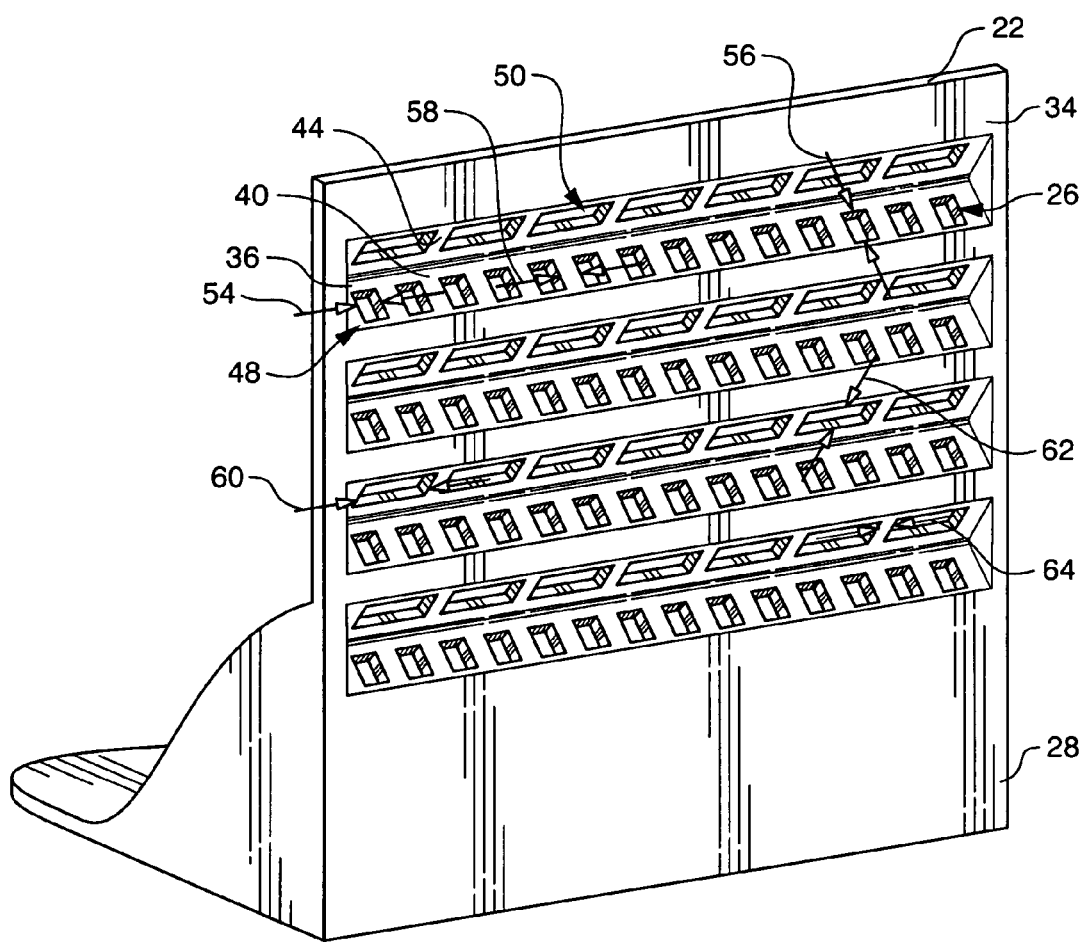
FIG. 2B illustrates an internal perspective cut-away view of the chassis and chassis panel of FIG. 2A, according to one embodiment of the invention.

FIGS. 2A and 2B illustrate respective internal and external cutaway views of an arrangement of the chassis 22. As shown, the chassis 22 includes a chassis panel 28 having a planar support portion 34 and a set of ventilation elements 26 extending from the support portion 34 of the panel 28 with each of the ventilation elements 26 defining an opening 36 relative to the support portion 34. The ventilation elements 26 extend into the chassis 22 of the computerized device 20 to maintain a substantially planar or flat profile of an exterior surface of the panel 28, thereby minimizing potential interference of the panel 28 with people or equipment passing in the vicinity of the chassis 22.

Each ventilation element 26 includes ventilation portions configured to control access to electronic components 24 disposed within the computerized device 20. In one arrangement, each ventilation element includes a first ventilation portion 40 that defines a first angle 42 of less than 180° relative to the plane of the support portion 34 and that defines a first set of openings 48. Each ventilation element 26 also includes a second ventilation portion 44 that defines a second angle 46 of less than 180° relative to the plane of the support portion 34 and that defines a second set of openings 50. Such a configuration of the ventilation elements 26 minimizes or prevents visual or physical access to the electronic components 24 disposed within the chassis 22, thereby allowing the chassis 22 to meet FIPS 140-2 Level 2 security standards, for example.

As indicated in FIG. 1A, the first ventilation portion 40 aligns the openings 48, along a line of sight 25, with electronic components 24 disposed along a bottom surface 52 of the chassis 22. For example, returning to FIGS. 2A and 2B, the first ventilation portion 40 forms an angle 42 of approximately 135° relative to a lower support portion 34-1 of the chassis panel 28 (e.g., a portion of the chassis panel 28 that attaches to the base 52 of the chassis 22) to align the openings 48 with the electronic components 24 carried by the computerized device 20. With such alignment, however, the first set of openings 48 is configured to visually obscure the electronic components 24 and limit the ability for a user to visually identify electronic components 24 disposed within the chassis 22. In one arrangement, the geometric configuration of each opening 48, and the overall pattern of the openings 48 formed in each first ventilation portion 40, limits or prevents visual or "line of sight" access to the electronic components 24.

For example, each opening 48 of the first ventilation portion 40 can be formed as a substantially rectangular shaped opening 48 having a width 54 between about 0.080 inches and 0.090 inches and a height 56 between about 0.080 inches and 0.090 inches with adjacent openings 48 being disposed at a relative spacing 58 of between about 0.050 inches and 0.065 inches. The relatively small size and layout of the openings 48 limit the ability for a user to visually identify the electronic components 24 disposed within the chassis 22. Additionally, the relatively small size of the openings 48 also limits the ability for a user to physically access the electronic components 24 through the first ventilation portion 40.

As indicated in FIG. 1B, the second ventilation portion 44 orients the openings 50 away from the electronic components 24 disposed along the bottom surface 52 of the chassis 22 where a line of sight 27 is directed away from the electronic components 24. As such, the second ventilation potions 44 provide ventilation to the computerized device 20 and limit the ability for a user to visually inspect or physically access the electronic components 24. For example, returning to FIGS. 2A and 2B, the second ventilation portion 44 forms an angle 46 of approximately 135° relative to an upper support portion 34-2 of the chassis panel 28 (e.g., a portion of the chassis panel 28 that attaches to an upper cover of the chassis 22) to orient the openings 50 away from the electronic components 24. With such orientation, the second ventilation portion 44 prevents visual or "line of sight" access to the electronic components 24 disposed within the chassis 22. Additionally, the geometric configuration of each opening 50 and the overall pattern of the openings 50 formed in the second ventilation portion 44 provide adequate air flow through the chassis 22 to allow cooling of the electronic components 24 during operation.

For example, each opening 50 of the second ventilation portion 44 can be formed as a substantially rectangular shaped opening 50 having a width 60 between about 0.180 inches and 0.190 inches and a height 62 between about 0.080 inches and 0.090 inches with adjacent openings 50 being disposed at a relative spacing 64 of between about 0.040 inches and 0.065 inches. Such a geometry and layout of the openings 50 allows for a sufficient flow of air through the chassis 22 to cool the electronic components 24 during operation. In one embodiment, such as the case where the chassis 22 is configured to provide a specific level of electromagnetic interference (EMI) shielding to the electronic components 24, the width 60 and height 62 of the openings are 0.19 inches by 0.08 inches with adjacent openings 50 being disposed at a relative spacing 64 of 0.04 inches.

As indicated above, the ventilation elements 26 are configured to allowing air to flow into and out of the chassis 22, through the opening 36 formed in the panel 28, to allow cooling of the electronic components 24. In one arrangement, the first sets of openings 48 and the second sets of openings 50 of the set of ventilation elements 26 define a free area ratio (FAR) of between about 42% and 48% relative to a surface area of the panel 28. This free area ratio helps to minimize air flow resistance created by the panel 28 and also helps to minimize an air flow pressure drop within the chassis 22 as air flows through the chassis to reduce the temperature of the electronic components 24.

Figure 3:
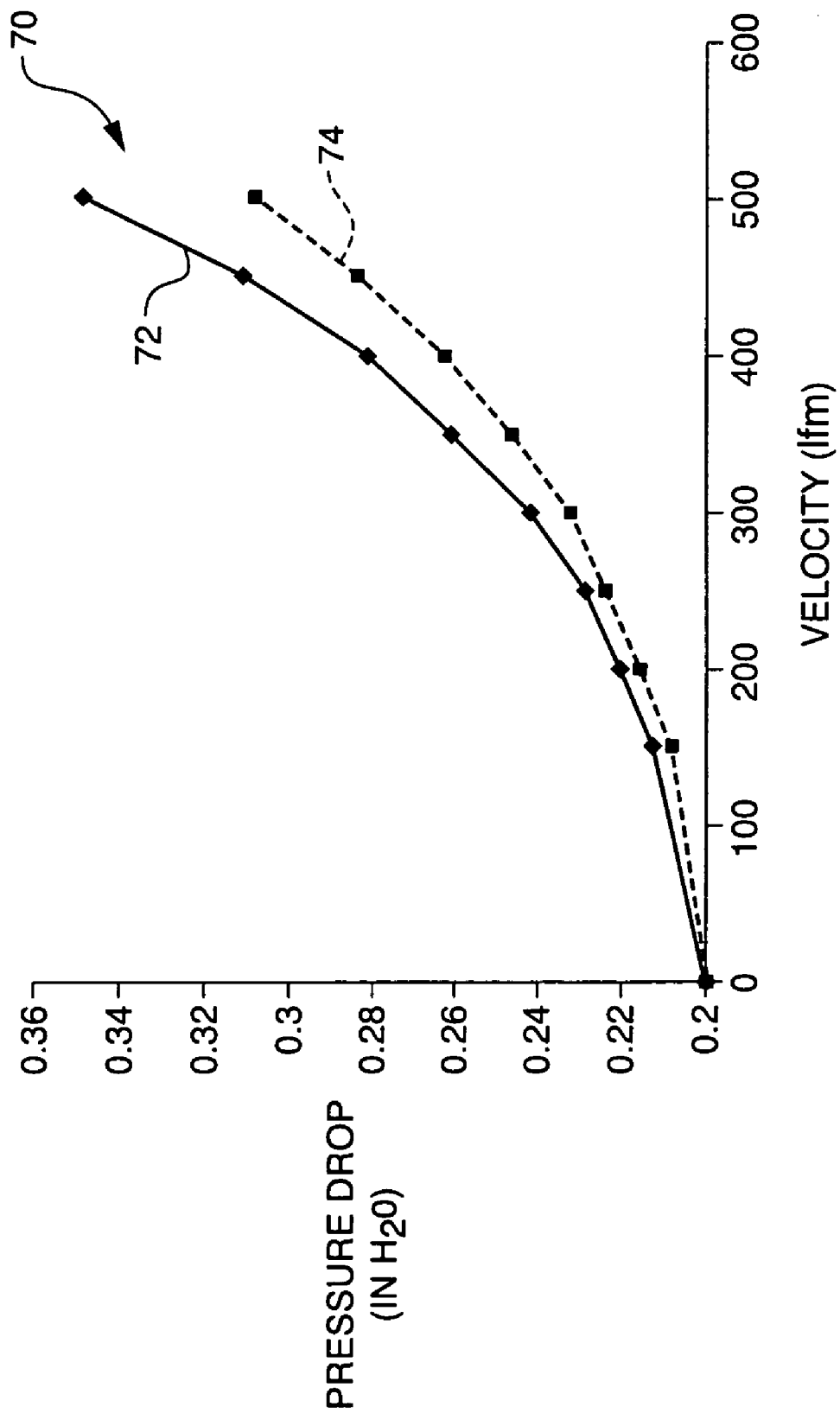
FIG. 3 is a graph that illustrates a pressure drop within a conventional FIPS-compliant chassis and a configuration of the chassis as illustrated in FIG. 1.

For example, FIG. 3 is a chart 70 that shows an example air flow pressure drop within a conventional FIPS 140-2 Level 2 chassis, given as curve 72, and an example air flow pressure drop within a configuration of the chassis 22 (e.g., such as illustrated in FIGS. 2A and 2B), given as curve 74. As shown, for an increase in air velocity through each of the chassis, the pressure drop within the conventional FIPS 140-2 Level 2 chassis having a FAR of approximately 33%, as indicated by curve 72, is greater than the pressure drop within the present chassis 22, as indicated by curve 74. In one arrangement, the pressure drop within the present chassis 22, as indicated by curve 74, is approximately 28% less than the pressure drop within the conventional FIPS 140-2 Level 2 chassis, as indicated by curve 72. Because the chassis 22 has a higher FAR and lower relative pressure drop relative to the conventional chassis, the chassis 22 minimizes "bottle-necking" of airflow through the chassis 22. As a result, the chassis 22 reduces the power required by fans, and potentially the acoustic noise level created by the fans, due to the relatively higher free area ratio.

Figure 4:
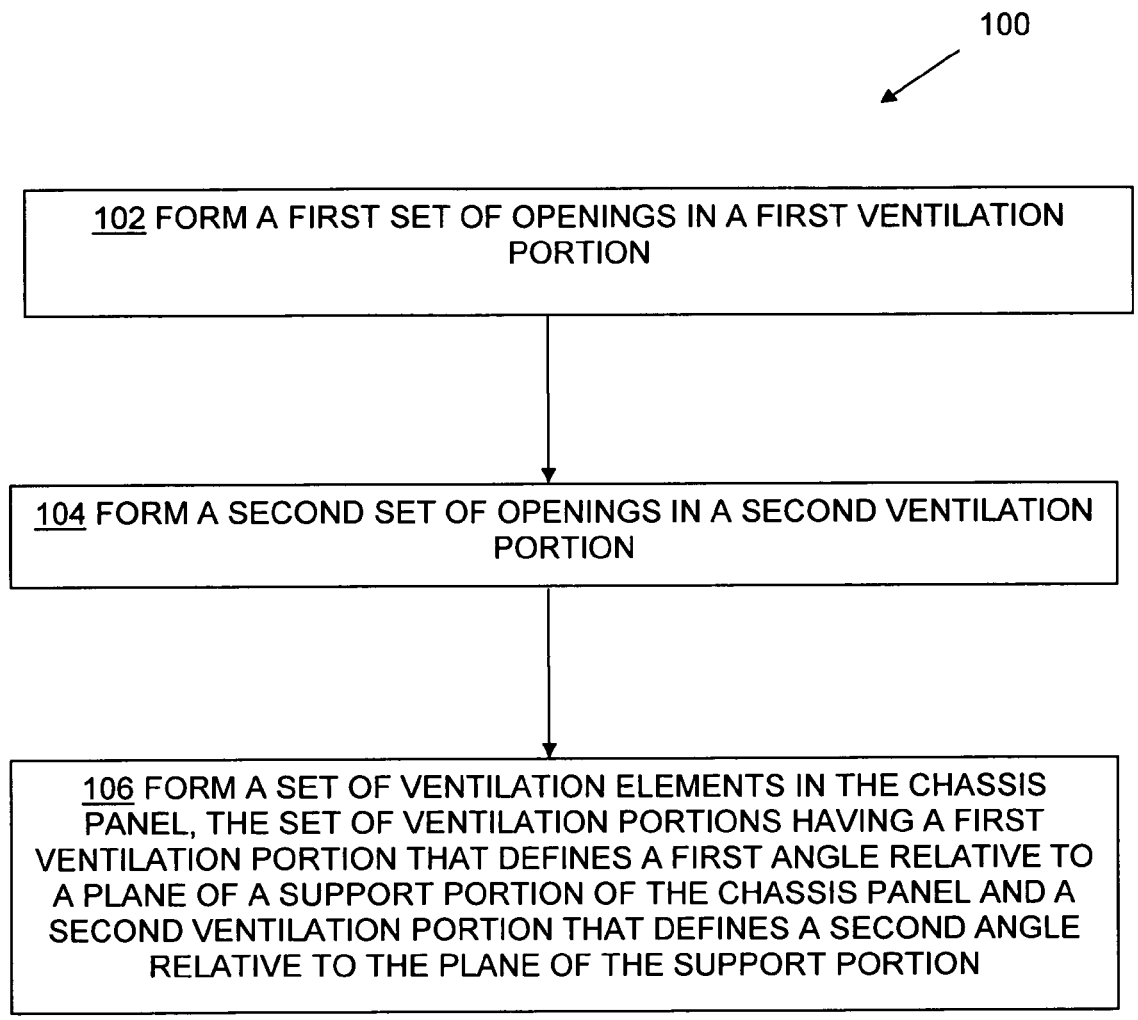
FIG. 4 is a flowchart illustrating a process for manufacturing the chassis panel of FIG. 1, according to one embodiment of the invention.

The ventilation elements 26 can be formed in the chassis panel 28 in a variety of ways. FIG. 4 is a flowchart 100 that illustrates a method for manufacturing the ventilation elements 26 as part of the chassis panel 28.

In step 102, a manufacturer forms a first set of openings 48 in a first ventilation portion 40 of the chassis 22. For example, the manufacturer punches the first set of openings 48 into the first ventilation portion 40 using a hole punching process. As indicated above, the geometric configuration of each opening 48, and the overall pattern of the openings 48 formed in each first ventilation portion 42, minimizes visual or "line of sight" access to electronic components 24 carried by a chassis 22 associated with the chassis panel 28.

In step 104, the manufacturer forms a second set of openings 50 in the second ventilation portion 44 of the chassis 22. For example, the manufacturer punches the second set of openings 50 into the second ventilation portion 44 using a hole punching process. As indicated above, the orientation of the second ventilation portion 44 relative to the support portion 34 prevents visual or "line of sight" access to the electronic components 24 disposed within the chassis 22. Additionally, the geometric configuration of each opening 50 and the overall pattern of the openings 50 formed in the second ventilation portion 44 provide adequate air flow through the chassis 22 to allow cooling of the electronic components 24 during operation.

In step 106, the manufacturer forms a set of ventilation elements 26 in the chassis panel 28 where the set of ventilation portions 26 include the first ventilation portion 40 that defines a first angle 42 relative to a plane of a support portion 34 of the chassis panel 28 and the second ventilation portion 44 that defines a second angle 46 relative to the plane of the support portion 34. For example, in a stamping process, the manufacturer stamps the chassis panel 28 to form the opening 26 within the chassis panel 28 and to bend the first and second ventilation portions 40, 44 relative to the chassis 22. As shown in FIGS. 2A and 2B, the ends of the first and second ventilation portions 40, 44 extending from the chassis panel 28 are integrally formed with each other and each ventilation element 26 is formed as having a generally triangular cross-section.

Figure 5A:
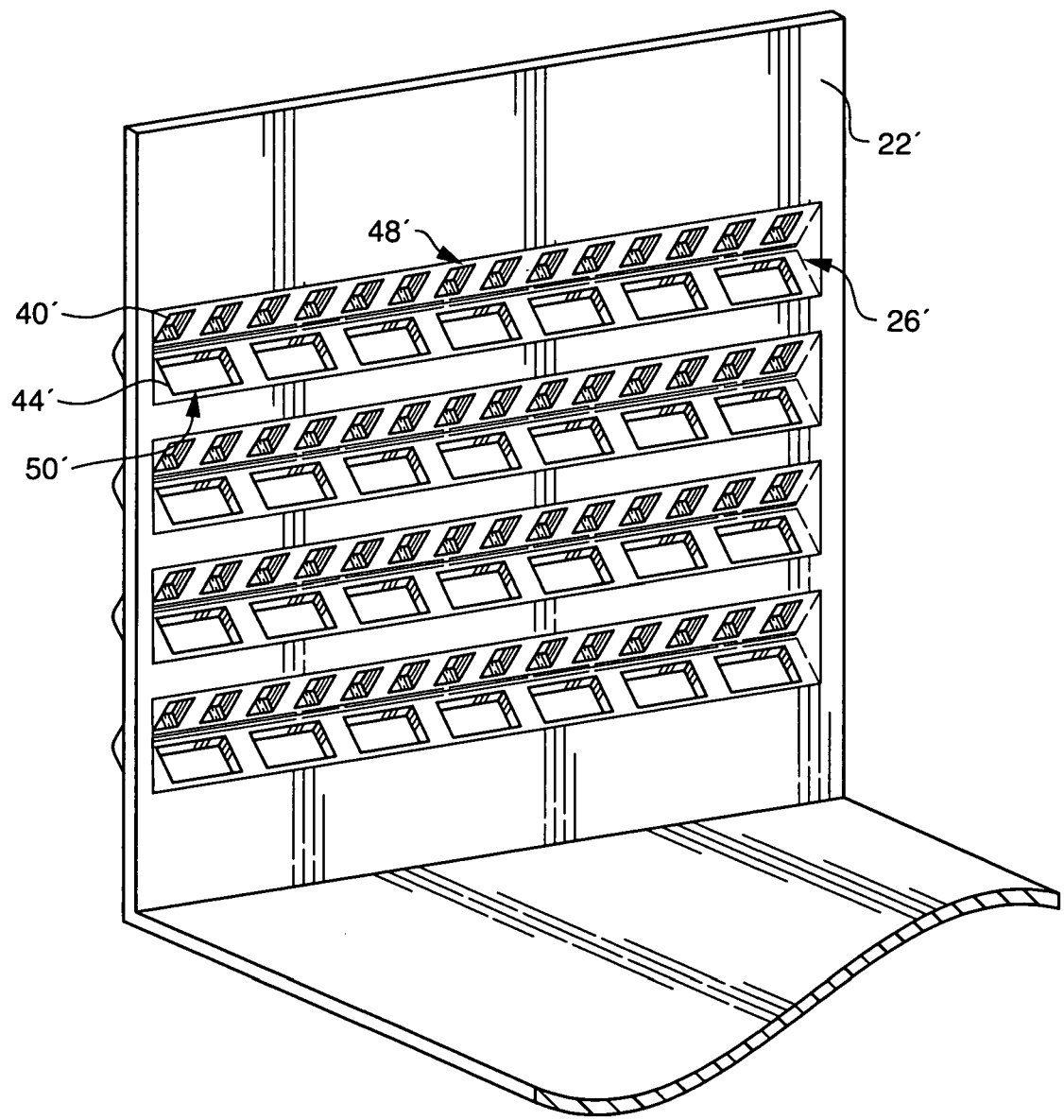
FIG. 5A illustrates a perspective cut-away view showing the inside of a chassis and chassis panel, according to one embodiment of the invention.
Figure 5B:
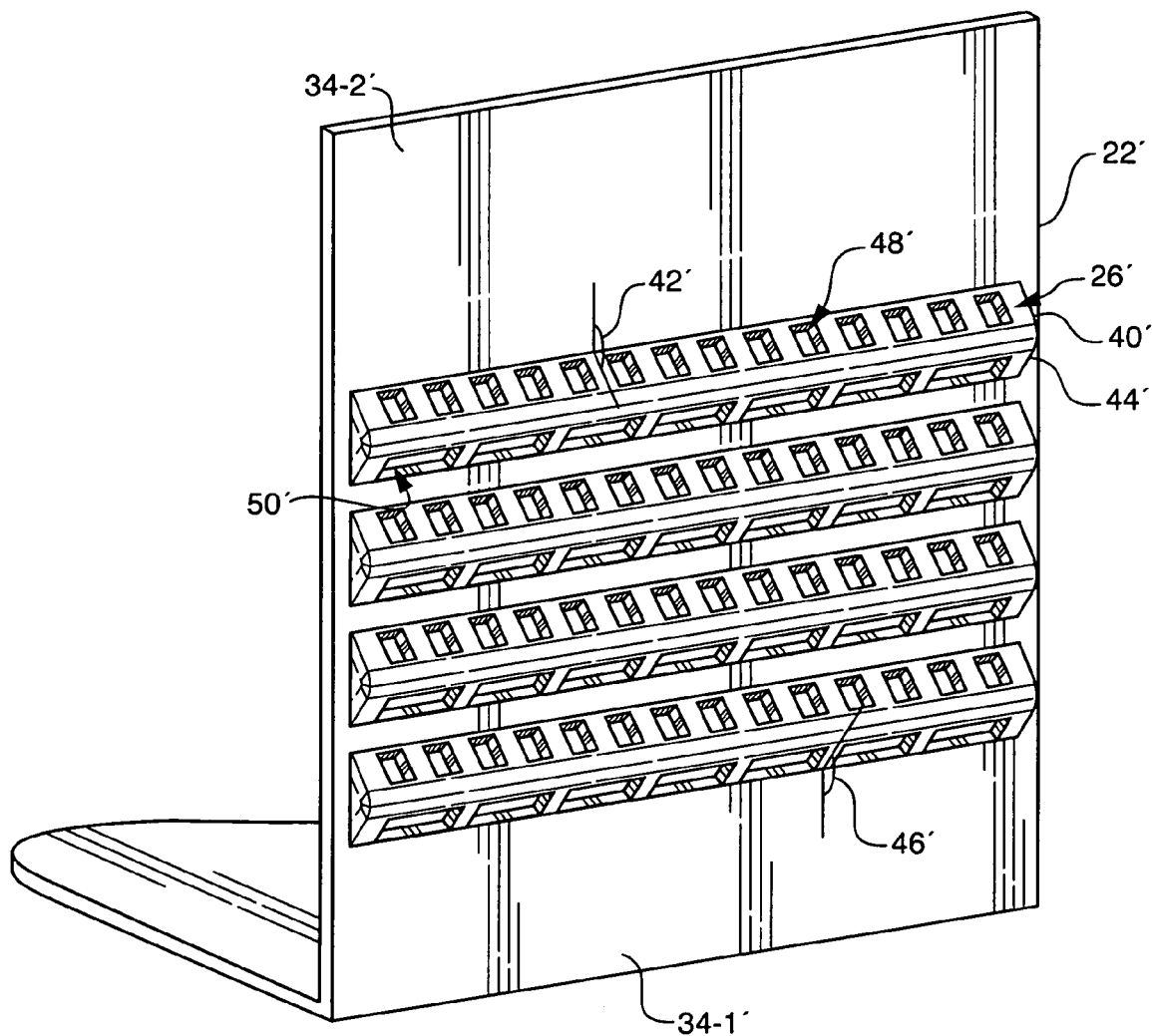
FIG. 5B illustrates an internal perspective cut-away view of the chassis and chassis panel of FIG. 5A, according to one embodiment of the invention.

As described above with respect to FIGS. 2A and 2B, the ventilation elements 26 can be formed in the chassis panel 28 such that the ventilation portions 40, 44 extend into the chassis 22 of the computerized device 20 to maintain a substantially planar or flat profile of an exterior surface of the panel 28. In an alternate embodiment, as shown in FIGS. 5A and 5B, the ventilation elements 26' can be formed in the chassis panel 28' such that the first and second ventilation portions 40', 44' extend away from an external surface of the chassis panel 28'. Such a configuration of the ventilation elements 26' maximizes the internal volume of the chassis 22 to provide space for the electronic components disposed therein.

As shown, the first ventilation portion 40' forms an angle 42', such as an angle 42' of approximately 135°, relative to an upper support portion 34-2' of the chassis panel 28' (e.g., a portion of the chassis panel 28 that attaches to the base 52 of the chassis 22) to align openings 48' defined by the first ventilation portion 40' with an electronic components 24 carried by the computerized chassis 22'. With such alignment, however, the first ventilation openings 48' are configured to visually obscure the electronic components 24. In one arrangement, the geometric configuration of each opening 48, and the overall pattern of the openings 48 formed in each first ventilation portion 42, limits or prevents visual or "line of sight" access to the electronic components 24.

Also as shown, the second ventilation portion 44' forms an angle 46', such as an angle 46' of approximately 135°, relative to a lower support portion 34-1' of the chassis panel 28' to orient the openings 50' away from electronic components 24 disposed within the chassis 22. With such orientation, the second ventilation portion 44' prevents visual or "line of sight" access to the electronic components 24. Additionally, the geometric configuration of each opening 50' and the overall pattern of the openings 50' formed in the second ventilation portion 44' provide adequate air flow through the chassis 22' to allow cooling of the electronic components 24 during operation.

While this invention has been particularly shown and described with references to preferred embodiments thereof, it will be understood by those skilled in the art that various changes in form and details may be made therein without departing from the spirit and scope of the invention as defined by the appended claims.

For example, as illustrated in FIGS. 1A and 1B, the ventilation elements 26 form a substantially triangular shaped cross-section. Such illustration is by way of example only. The ventilation elements 26 can be configured as having a variety of cross-sectional shapes. For example, in one arrangement, the first and second ventilation portions 40, 44 of the ventilation elements 26 are curved relative to the planar surface of the chassis panel 28 such that the ventilation elements 26 form a substantially semi-circular cross-sectional shape.

In another example, as shown in FIGS. 2A and 2B, the ends of the first and second ventilation portions 40, 44 that extend from the chassis panel 28 are joined together. Such illustration is by way of example only. In one arrangement, the first and second ventilation portions 40, 44 are not joined together but instead define a gap in each ventilation element 26. The gap formed between opposed first and second ventilation portions 40, 44, in one arrangement, is sufficiently small so as to visually obscure or limit the ability for a user to visually identify electronic components 24 disposed within the associated chassis 22.

As illustrated in FIGS. 2A and 2B, the first and second sets of openings 48, 50 are configured as substantially rectangular shaped opening. Such description was by way of example only. In one arrangement, either the first set, the second set, or both the first and second sets of openings 48, 50 can be configured as having a circular, triangular, or any other geometric shape.

As shown in FIGS. 2A and 2B, the chassis panel 28 forms part of the chassis 22 of a computerized device 20. One of ordinary skill in the art will understand that the chassis panel 28 can be integrally formed with the chassis 22 or can be removably attached to the chassis 22, such as via fasteners.

As shown in FIGS. 1A and 1B, the chassis 22 includes a single chassis panel 28 having ventilation elements 26. In one arrangement, the chassis panel 28 can be configured as an intake panel to receive air from the environment to allow cooling of the electronic components 24 disposed therein. In one arrangement, the chassis panel 28 can be configured as an outlet panel to allow high temperature air within the chassis 22 to be blown from the chassis 22 to the surrounding atmosphere, such as by using a fan assembly disposed within the chassis 22. In another arrangement, the chassis 22 can include more than one chassis panel 28 having the ventilation elements 26 to allow cooling of the electronic components 24. For example, in one arrangement and referring to FIGS. 1A and 1B, the chassis 22 can include a first chassis panel 28 and a second chassis panel 29, opposing the first chassis panel 28. In such a configuration, the chassis 22 allows air to flow through the chassis 22 from an inlet panel, such as panel 28, to an outlet panel, such as panel 29.

As indicated in FIGS. 1A and 1B, the circuit board 30 and electronic components 24 are disposed along a bottom surface 52 of the chassis 22 where the first set of openings 48 are configured to visually obscure the electronic components 24 and limit the ability for a user to visually identify electronic components 24 disposed within the chassis 22. Such illustration is by way of example only. In one arrangement, the circuit board 30 and electronic components 24 are disposed along an opposing top surface of the chassis 22. In such a configuration, the second set of openings 50 can be configured to visually obscure the electronic components 24 to limit or prevent visual or "line of sight" access to the electronic components 24 while the first set of openings can be configured to allow adequate airflow through the chassis 22.

What is claimed is:

1. A chassis panel for an electronic device, comprising:
a support portion defining a plane; and
a set of ventilation elements extending from the support portion, each ventilation element having (i) a first ventilation portion that defines a first angle of less than 180° relative to the plane of the support portion and that defines a first set of openings and (ii) a second ventilation portion that defines a second angle of less than 180° relative to the plane of the support portion and that defines a second set of openings, the set of ventilation elements configured to control access to an electronic component disposed within the electronic device,
wherein the first set of openings is configured to provide limited visual access to the electronic component carried by the electronic device, the second set of openings is configured to provide no visual access to the electronic component carried by the electronic device, and wherein the first set of openings are different in size relative to the second set of openings.

2. The chassis panel of claim 1, wherein the first set of openings defined by the first ventilation portion are different in size relative to the second set of openings defined by the second ventilation portion.

3. The chassis panel of claim 1, wherein the first ventilation portion is configured to visually obscure an electronic component carried by the electronic device.

4. The chassis panel of claim 3, wherein:
each opening of the first set of openings has a width between about 0.080 inches and 0.090 inches and a height between about 0.080 inches and 0.090 inches; and
adjacent openings of the first set of openings are disposed at a relative spacing of between about 0.040 inches and 0.065 inches.

5. The chassis panel of claim 1, wherein the second ventilation portion orients the second set of openings away from the electronic components disposed within the electronic device.

6. The chassis panel of claim 5, wherein:
each opening of the second set of openings has a width between about 0.180 inches and 0.190 inches and a height between about 0.080 inches and 0.090 inches; and
adjacent openings of the second set of openings are disposed at a relative spacing of between about 0.040 inches and 0.065 inches.

7. The chassis panel of claim 1, wherein the first ventilation portion comprises an end extending from the support portion and the second ventilation portion comprises an end extending from the support portion, the end of the first ventilation portion being integrally formed with the end of the second ventilation portion.

8. The chassis panel of claim 1, wherein the first sets of openings and the second sets of openings of the set of ventilation elements define a free area ratio of between about 42% and 48% relative to an area of the panel.

9. The chassis panel of claim 1, wherein:
the first set of openings defined by the first ventilation portion extend though the first ventilation portion between a first surface of the first ventilation portion and an opposing second surface of the first ventilation portion; and
the second set of openings defined by the second ventilation portion extend though the second ventilation portion between a first surface of the second ventilation portion and an opposing second surface of the second ventilation portion.

10. A computerized device, comprising:
a chassis;
an electronic component disposed within the chassis; and
at least one panel forming a wall of the chassis, the panel comprising:
a support portion defining a plane; and
a set of ventilation elements extending from the support portion, each ventilation element having (i) a first ventilation portion that defines a first angle of less than 180° relative to the plane of the support portion and that defines a first set of openings and (ii) a second ventilation portion of less than 180° that defines a second angle relative to the plane of the support portion and that defines a second set of openings, the set of ventilation elements configured to control access to the electronic component disposed within the computerized device,
wherein the first set of openings is configured to provide limited visual access to the electronic component carried by the computerized device, the second set of openings is configured to provide no visual access to the electronic component carried by the computerized device, and wherein the first set of openings are different in size relative to the second set of openings.

11. The computerized device of claim 10, wherein the first set of openings defined by the first ventilation portion are different in size relative to the second set of openings defined by the second ventilation portion.

12. The computerized device of claim 10, wherein the first ventilation portion is configured to visually obscure an electronic component carried by the computerized device.

13. The computerized device of claim 12, wherein:
each opening of the first set of openings has a width between about 0.080 inches and 0.090 inches and a height between about 0.080 inches and 0.090 inches; and
adjacent openings of the first set of openings are disposed at a relative spacing of between about 0.040 inches and 0.065 inches.

14. The computerized device of claim 10, the second ventilation portion orients the second set of openings away from the electronic components disposed within the computerized device.

15. The computerized device of claim 14, wherein:
each opening of the second set of openings has a width between about 0.180 inches and 0.190 inches and a height between about 0.080 inches and 0.090 inches; and
adjacent openings of the second set of openings are disposed at a relative spacing of between about 0.040 inches and 0.065 inches.

16. The computerized device of claim 10, wherein the first ventilation portion comprises an end extending from the support portion and the second ventilation portion comprises an end extending from the support portion, the end of the first ventilation portion being integrally formed with the end of the second ventilation portion.

17. The computerized device of claim 10, wherein the first sets of openings and the second sets of openings of the set of ventilation elements define a free area ratio of between about 42% and 48% relative to an area of the panel.

18. The computerized device of claim 10, wherein:
the first set of openings defined by the first ventilation portion extend though the first ventilation portion between a first surface of the first ventilation portion and an opposing second surface of the first ventilation portion; and
the second set of openings defined by the second ventilation portion extend though the second ventilation portion between a first surface of the second ventilation portion and an opposing second surface of the second ventilation portion.

19. The computerized device of claim 10, wherein at least one ventilation element is disposed on the support portion in a location internal to the chassis.

20. The computerized device of claim 10 wherein at least one ventilation element is disposed on the support portion in a location external to the chassis.

21. A method for manufacturing a chassis panel, comprising:
forming a set of ventilation elements in the chassis panel, the set of ventilation portions having a first ventilation portion that defines a first angle relative to a plane of a support portion of the chassis panel and a second ventilation portion that defines a second angle relative to the plane of the support portion;
forming a first set of openings in the first ventilation portion to provide limited visual access to an electronic component carried by the chassis; and
forming a second set of openings in the second ventilation portion to provide no visual access to an electronic component carried by the chassis.

22. The method of claim 21, wherein forming the first set of openings in the first ventilation portion comprises:
forming each opening of the first set of openings with a width between about 0.080 inches and 0.090 inches and a height between about 0.080 inches and 0.090 inches; and
disposing adjacent openings of the first set of openings at a relative spacing of between about 0.040 inches and 0.065 inches.

23. The method of claim 21, wherein forming the second set of openings in the second ventilation portion comprises:
forming each opening of the second set of openings with a width between about 0.180 inches and 0.190 inches and a height between about 0.080 inches and 0.090 inches; and
disposing adjacent openings of the second set of openings at a relative spacing of between about 0.050 inches and 0.065 inches.

* * * * *